United States Patent
Cai et al.

(10) Patent No.: US 10,217,766 B2
(45) Date of Patent: *Feb. 26, 2019

(54) SYSTEM ON CHIP FULLY-DEPLETED SILICON ON INSULATOR WITH RF AND MM-WAVE INTEGRATED FUNCTIONS

(71) Applicant: International Business Machines Corporation, Armonk, NY (US)

(72) Inventors: Jin Cai, Cortlandt Manor, NY (US); Jean-Olivier Plouchart, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/794,257

(22) Filed: Oct. 26, 2017

(65) Prior Publication Data

US 2018/0053785 A1    Feb. 22, 2018

Related U.S. Application Data

(63) Continuation of application No. 15/239,230, filed on Aug. 17, 2016.

(51) Int. Cl.
*H01L 27/01* (2006.01)
*H01L 27/12* (2006.01)
(Continued)

(52) U.S. Cl.
CPC ...... *H01L 27/1203* (2013.01); *H01L 21/0273* (2013.01); *H01L 21/02238* (2013.01);
(Continued)

(58) Field of Classification Search
CPC ............. H01L 21/76254; H01L 21/84; H01L 27/1203; H01L 21/30604; H01L 21/02238; H01L 21/30625; H01L 21/0273
See application file for complete search history.

(56) References Cited

U.S. PATENT DOCUMENTS 5,883,396 A    3/1999   Reedy et al.
6,492,209 B1   12/2002  Krishnan et al.
(Continued)

FOREIGN PATENT DOCUMENTS

CN    102290377    12/2011
CN    102412180    4/2012

OTHER PUBLICATIONS

Nguyen, B., et al., "Overview of FDSOI Technology from Substrate to Device", International Semiconductor Device Research Symposium, Dec. 9-11, 2009, pp. 1-2.
(Continued)

*Primary Examiner* — Jasmine Clark
(74) *Attorney, Agent, or Firm* — Fleit Gibbons Gutman Bongini Bianco PL; Donna Flores

(57) ABSTRACT

A radio frequency fully depleted silicon on insulator (RF-FDSOI) device and method of fabrication are provided. A silicon wafer for digital circuits is constructed using fully depleted silicon on insulator technology having a thin buried oxide layer. Localized areas of the silicon wafer are constructed for radio frequency circuits and/or passive devices. The silicon wafer has a silicon substrate having a resistivity greater than 1 KΩ·cm. The localized areas of the silicon wafer may include a trap rich layer implanted underneath a thin buried oxide layer. The localized areas of the silicon wafer may include a buried oxide layer that is thicker than the thin buried oxide layer. The thicker oxide layer is between 20 and 2000 nm thick. The localized areas of the silicon wafer may include a trap rich layer implanted underneath the thicker buried oxide layer.

18 Claims, 17 Drawing Sheets

(51) Int. Cl.
    *H01L 21/027*     (2006.01)
    *H01L 21/70*     (2006.01)
    *H01L 21/762*     (2006.01)
    *H01L 21/84*     (2006.01)
    *H01L 21/306*     (2006.01)
    *H01L 21/02*     (2006.01)
    *H01L 27/13*     (2006.01)

(52) U.S. Cl.
    CPC .. *H01L 21/30604* (2013.01); *H01L 21/30625* (2013.01); *H01L 21/76254* (2013.01); *H01L 21/84* (2013.01); *H01L 27/13* (2013.01)

(56) References Cited

U.S. PATENT DOCUMENTS

| | | | |
|---|---|---|---|
| 6,649,944 B2 | 11/2003 | Ker et al. | |
| 7,087,967 B2 | 8/2006 | Mori et al. | |
| 8,865,539 B2 | 10/2014 | Chen et al. | |
| 9,356,144 B1* | 5/2016 | Mason | H01L 27/0255 |
| 9,899,415 B1* | 2/2018 | Cai | H01L 27/1203 |
| 2007/0099372 A1 | 5/2007 | Chittipeddi et al. | |
| 2014/0319612 A1 | 10/2014 | Brawley | |
| 2015/0115480 A1 | 4/2015 | Peidous et al. | |

OTHER PUBLICATIONS

Eggert, D., et al., "A SOI-RF-CMOS Technology on High Resistivity SIMOX Substrates for Microwave Applications to 5 GHz", IEEE Transactions on Electron Devices, Nov. 1997, pp. 1-9, vol. 44, No. 11.

Tsuchiya, R., et al., "Silicon on Thin BOX: A New Paradigm of the CMOSFET for Low-Power and High-Performance Application Featuring Wide-Range Back-Bias Control", IEEE International Electron Devices Meeting, Dec. 2004, pp. 1-4.

Wikipedia, "Smart Cut", https://en.wikipedia.org/wiki/Smart_cut, last visited on Mar. 25, 2016, pp. 1-2.

Non Final Office Action for U.S. Appl. No. 15/239,230 dated Apr. 14, 2017.

\* cited by examiner

SYSTEM ON CHIP FULLY-DEPLETED SILICON ON INSULATOR WITH RF AND MM-WAVE INTEGRATED FUNCTIONS

BACKGROUND

Field of Invention

The present disclosure generally relates to system-on-a-chip (SoC) applications, and more particularly relates to a fully depleted silicon on insulator (FDSOI) that allows integration of ultra-low power digital design with RF field-effect transistors (FETs) and high-Q passives.

Description of the Related Art

Fully-depleted silicon on insulator (FDSOI) with ultra-thin buried oxide (BOX) and back bias is a leading technology platform for ultra-low power digital design as the FET threshold voltage ($V_t$) can be tuned over a broad range to meet low leakage requirements during stand-by and high performance requirements during active operation.

For radio frequency (RF) applications, partially-depleted silicon on insulator (RF-SOI) on thick buried oxide (BOX) and a high resistivity substrate has become a successful technology platform. Conventional bulk complementary metal-oxide semiconductor (CMOS) uses low-power, high $V_t$ devices for low leakage applications, but the performance is low and the $V_t$ cannot be tuned.

However, neither of the above technologies can address both low-leakage digital CMOS and low dissipation RF with high-Q passive requirements needed for SoC applications. The two technology platforms have conflicting requirements on substrate materials including BOX thickness. For example, with ultra-thin BOX on the order of 10-15 nm, the CMOS threshold voltage can be effectively tuned over a wide range, however, there is excessive AC leakage between the drain and the substrate during high frequency RF operation due to the thin BOX. If thick BOX is used to reduce AC leakage of RF CMOS and the loss in other passives, $V_t$ tuning capability in digital CMOS is compromised.

FIG. 1 shows one example of a prior art FET 100 which uses FDSOI technology for digital and SRAM applications. The FET 100 shown in FIG. 1 contains two devices: an NFET 102 and a PFET 104. NFET 102 is a symmetrical device such that either junction area 108a, 108b flanking gate 106 may be used as the source or the drain. Junction area 108a, 108b is referenced herein, collectively or generally, as source/drain 108. It should be noted that gate 106, as referenced herein, is commonly known as a "gate stack" comprising a metal contact insulated from a lightly positively doped (P−−) area of silicon layer 120 by a thin oxide layer. Source/drain 108 comprises a metal contact positioned above a highly negatively doped (N+) area of silicon layer 120. Likewise, gate 110 of PFET 104 is flanked by symmetrical junction areas 112a, 112b, either of which may be used as the source or the drain (referenced herein, collectively or generally, as source/drain 112). Gate 110 comprises a metal contact insulated from a lightly negatively doped (N−−) area of silicon layer 120 by a thin oxide layer. Source/drain 112 comprises a metal contact positioned above a highly positively doped (P+) area of silicon layer 120.

Threshold voltage ($V_t$) for the NFET 102 may be adjusted by applying a voltage at contact 114. Likewise, $V_t$ for the PFET 104 may be adjusted by applying a voltage at contact 116. An oxide barrier 118a, 118b, 118c (referenced herein, collectively or generally, as oxide layer 118) provides isolation between adjacent areas (e.g., NFET 102 and PFET 104, contact 114 and NFET 102, contact 116 and PFET 104, etc.) as well as lessening positive capacitance between silicon layer 120 and a thin buried oxide (BOX) layer 122. The silicon layer 120 is approximately 6-8 nm thick and the thin BOX layer 122 is approximately 10-15 nm. Underneath the BOX layer 122 is a large back-side conductive layer 124 which has a high resistance. The BOX layer 122 allows for a large range for $V_t$ tuning. However, for RF/mmwave applications, the current FDSOI design does not provide enough isolation and the voltage break-down is too low due to the thin BOX layer 122 and the back-side conductive layer 124. For example, the maximum electrostatic field that the SiO2 BOX can reliably tolerate is 7 MV/cm. Therefore, a 10 nm BOX will have a maximum voltage that can be applied across it 100× lower than for 1 um BOX. For a 10 nm BOX the maximum voltage that can be applied across is 7V. In contrast, the voltage break-down provided in RF-SOI may be as high as 20V.

BRIEF SUMMARY

In one embodiment, a method for fabricating radio frequency fully depleted silicon on insulator (RF-FDSOI) devices is disclosed. The method comprises constructing a silicon wafer for digital circuits using fully depleted silicon on insulator technology having a thin buried oxide layer and constructing localized areas of the silicon wafer for at least one of radio frequency circuits and passive devices.

In another embodiment, a radio frequency fully depleted silicon on insulator (RF-FDSOI) device comprises a silicon wafer for digital circuits using fully depleted silicon on insulator technology having a thin buried oxide layer and localized areas of the silicon wafer comprising at least one of radio frequency circuits and passive devices.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

In this disclosure, a method is provided for a new FDSOI technology, called RF-FDSOI, with a thin BOX layer for digital circuits and locally thickened BOX areas, with or without a trap rich layer underneath for RF CMOS and passives for low-loss/high-Q properties. The new RF-FD-SOI technology allows the integration of ultra-low power digital with RF FETs and high-Q passives, thereby enabling the design of ultra-low power monolithic System-on-Chip (SoC) addressing the emerging Internet of Things (IoT) market. The logic/SRAM portions of the RF-FDSOI have the conventional FDSOI structure with a thin BOX for $V_t$ tuning. However, RF/mm-wave portions are constructed using new structures described herein for minimizing substrate loss.

In one embodiment, the entire region for RF and passives have a thick BOX layer underneath. In another embodiment, RF and passive devices have a localized trap rich layer underneath a thin BOX. In another embodiment, the RF and passive devices have both a thick BOX layer and a trap rich layer underneath the thick BOX layer.

Figure 1:
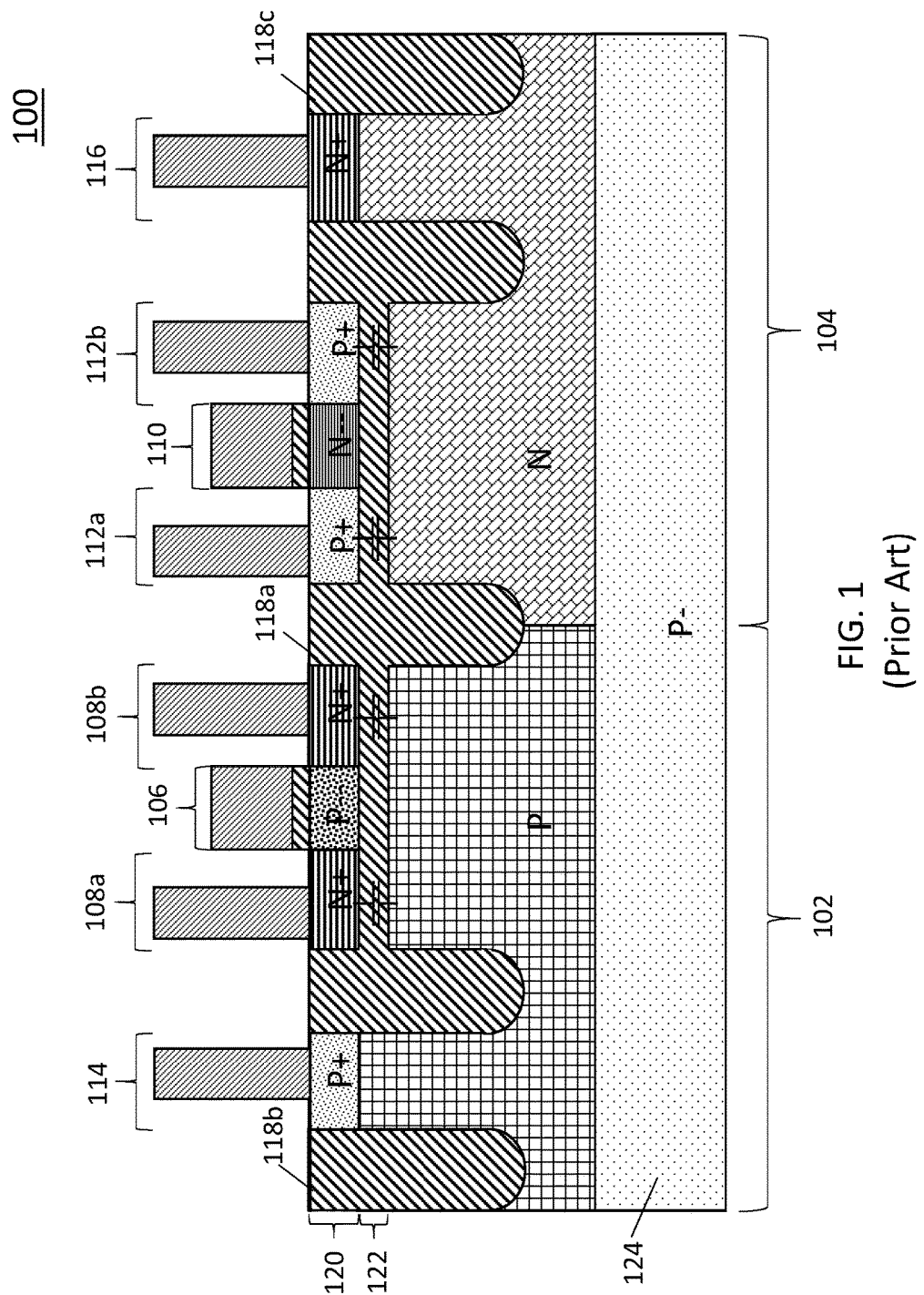
FIG. 1 is a cross-sectional illustration of a prior art example of FDSOI used in digital and Static Random Access Memory (SRAM) applications.
Figure 2:
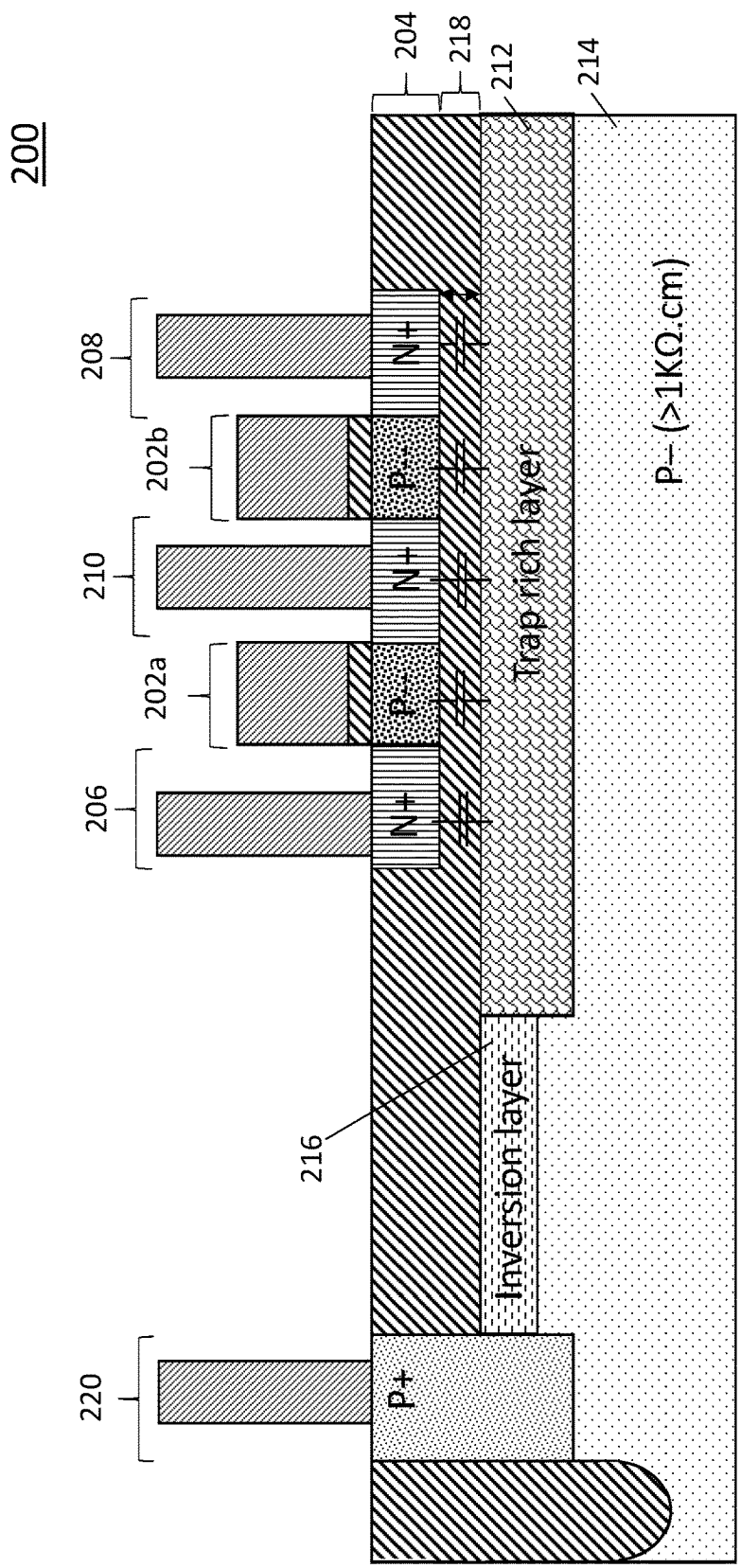
FIG. 2 is a cross-sectional illustration showing one example of an RF/mmWave NFET using RF-FDSOI on a high-resistivity substrate with a trap rich layer according to one embodiment of the present disclosure.

Turning now to FIG. 2, a cross-sectional illustration of one example of an RF/mmWave dual-gate NFET 200 using RF-FDSOI on a high-resistivity substrate with a trap rich layer is shown according to one embodiment of the present disclosure. NFET 200 includes two gate stacks 202a, 202b, each comprising a metal conductor insulated from a lightly positively doped (P--) portion of a silicon layer 204 by a thin oxide layer. Source 206 comprises a metal contact positioned above a highly negatively doped (N+) area of silicon layer 204. Likewise, drain 208 also comprises a metal contact positioned above a highly negatively doped (N+) area of silicon layer 204. Dual-gate NFET 200 is essentially two NFETs arranged in parallel such that junction area 210 serves as the drain of one NFET and the source of the other NFET in order to drive more current.

NFET 200 is selectively positioned above a trap rich layer 212 on a high-resistivity (e.g., ρ>1 KΩ·cm) substrate 214 for ultimate isolation and linearity. The new structure proposes selectively creating the trap rich layer 212 underneath the RF devices and passives and providing pockets with traps and pockets with inversion layers 216.

The BOX layer always has some residual charges trapped in the oxide. These residual charges create an inversion layer 216 at the interface between the BOX and the silicon substrate. This inversion layer 216, made of free charges, allows generation of a parasitic current between the drain and the source of the FET. This leakage current is a big problem because it degrades the FET RF performance, especially its linearity.

The trap rich layer 212 is used to trap these free charges from the inversion layer 216, and therefore there is no leakage current. The isolation and the linearity of the FET/varactor/inductor/vncap with a trap rich layer 212 underneath is therefore very high (in other words, the highest currently possible for Si technology).

The trap rich layer 212 minimizes charges at the interface between the substrate 214 and the BOX 218. The trap rich layer is formed by sending ions which creates traps by destroying the Si. In this embodiment, the inversion layer 216 is used to design a lower pass resistance between the substrate contact and the FET body, allowing the FET threshold voltage $V_t$ to be tuned with a lower resistance as compared to a design where the trap rich layer 212 is everywhere. Having a lower resistance is desirable because it allows a lower voltage to be used to tune the FET Vth. For FD-SOI, it is very desirable to tune the FET $V_t$ because of its wafer to wafer variability.

In this embodiment, the silicon layer 204 is approximately 6-8 nm and the thin BOX is approximately 10-15 nm. The substrate contact 220 allows tuning of the RF/mmWave FET $V_t$.

Figure 3:
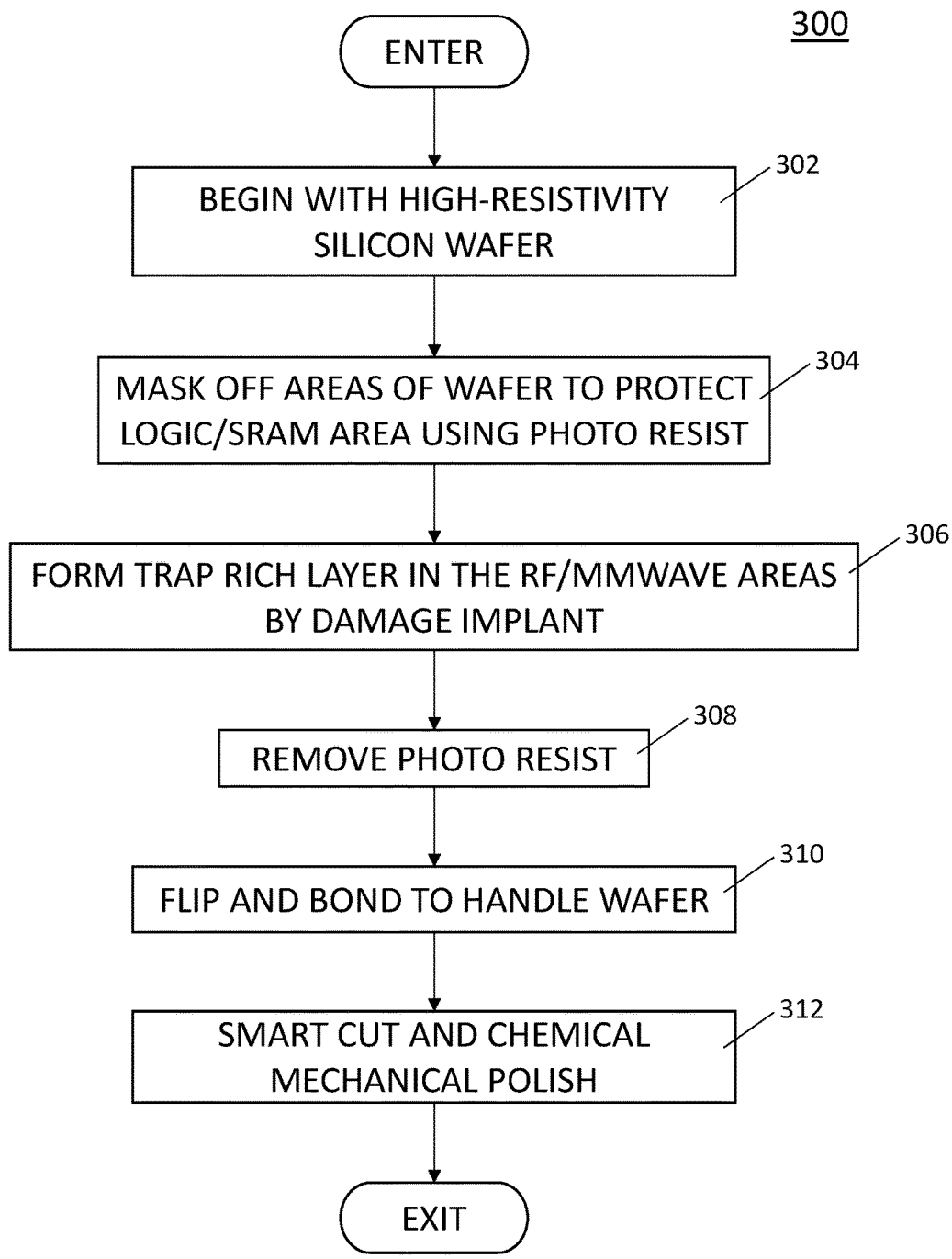
FIG. 3 is an operational flow diagram illustrating a process for manufacturing a RF-FDSOI wafer with a trap rich layer according to one embodiment of the present disclosure.
Figure 4:
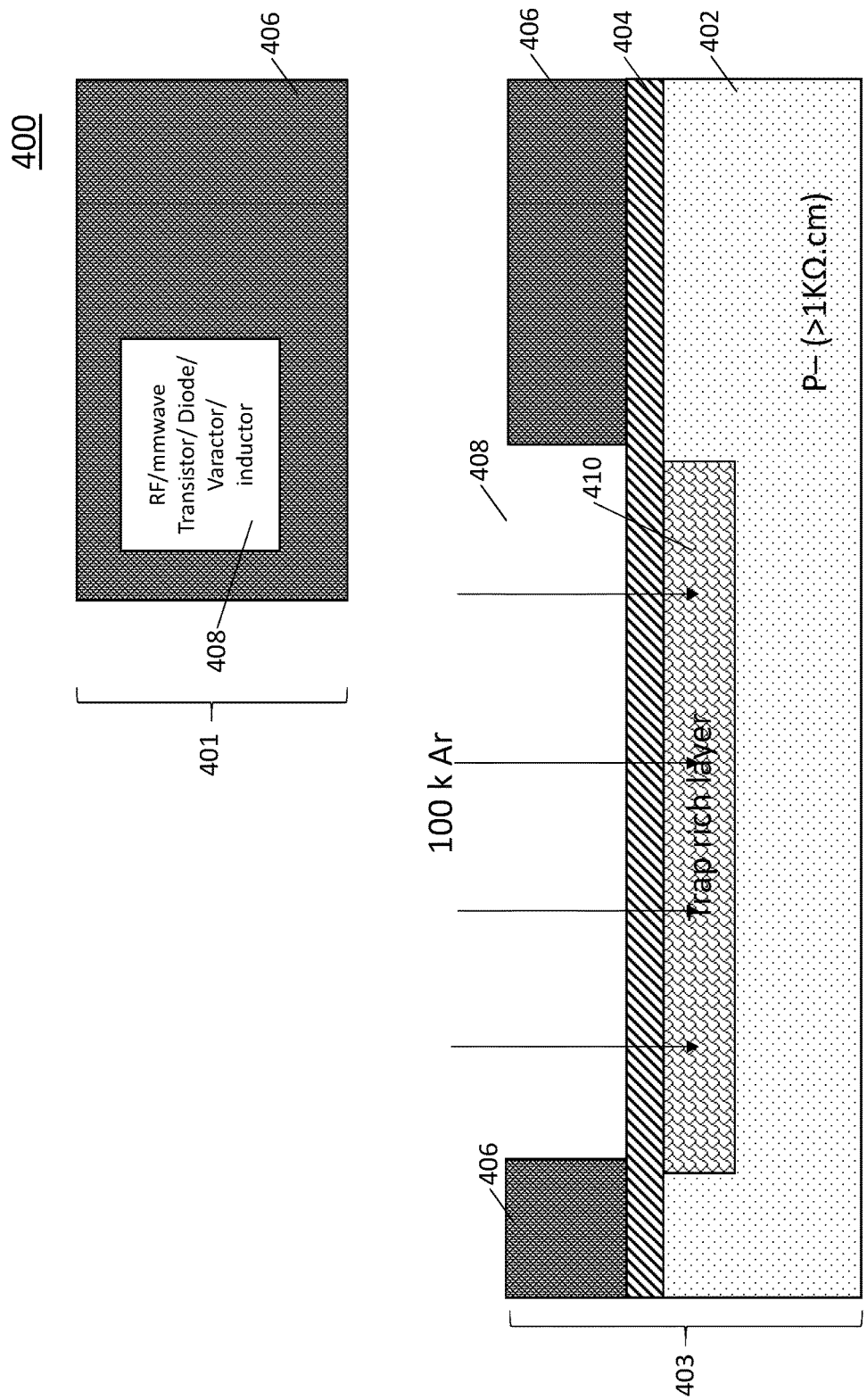
FIG. 4 is an illustration showing one example of a RF-FDSOI wafer using the process of FIG. 3.

Turning now to FIG. 3, an operational flowchart 300 is provided illustrating a process for manufacturing a RF-FDSOI wafer with a thin BOX and trap rich layer, such as wafer 400 of FIG. 4, according to one embodiment of the present disclosure. FIG. 4 contains a top view 401 of wafer 400, as well as a cross-sectional view 403 of the side of wafer 400. It should be noted that the top view 401 and the cross-sectional view 403 are not to scale. The process begins, at step 302, with a high-resistivity silicon wafer 402 having a super thin oxide layer 404 (e.g., around 5-20 nm). Areas of the wafer 400 that are designated for digital logic and/or SRAM functionality are masked off, at step 304, using photo resist 406. Thus, the areas 408 of the wafer 400 that are designated for RF/mmWave usage are left exposed. A trap rich layer 410 is formed, at step 306, in the areas 408 designated for RF/mmWave usage by damage implantation underneath the thin oxide layer 404. The trap rich layer 410 may be around 50-100 nm thick. Examples of the damage implant may include argon (Ar) or proton implantation. The photo resist layer 406 is removed, at step 308 (e.g., by etching). The wafer 400 is flipped and bonded, at step 310, to a handle wafer (not shown) and is smart cut and chemical mechanical polished, at step 312, according to known methods. The wafer 400 is then ready to have active device circuits grown, wherein the RF/mmWave circuits and passive components are formed in areas above the trap rich layer and any digital/logic or SRAM circuitry is formed in areas without the trap rich layer. It should be noted that the thin oxide layer 404 will become a thin BOX after the smart cut process.

Figure 5:
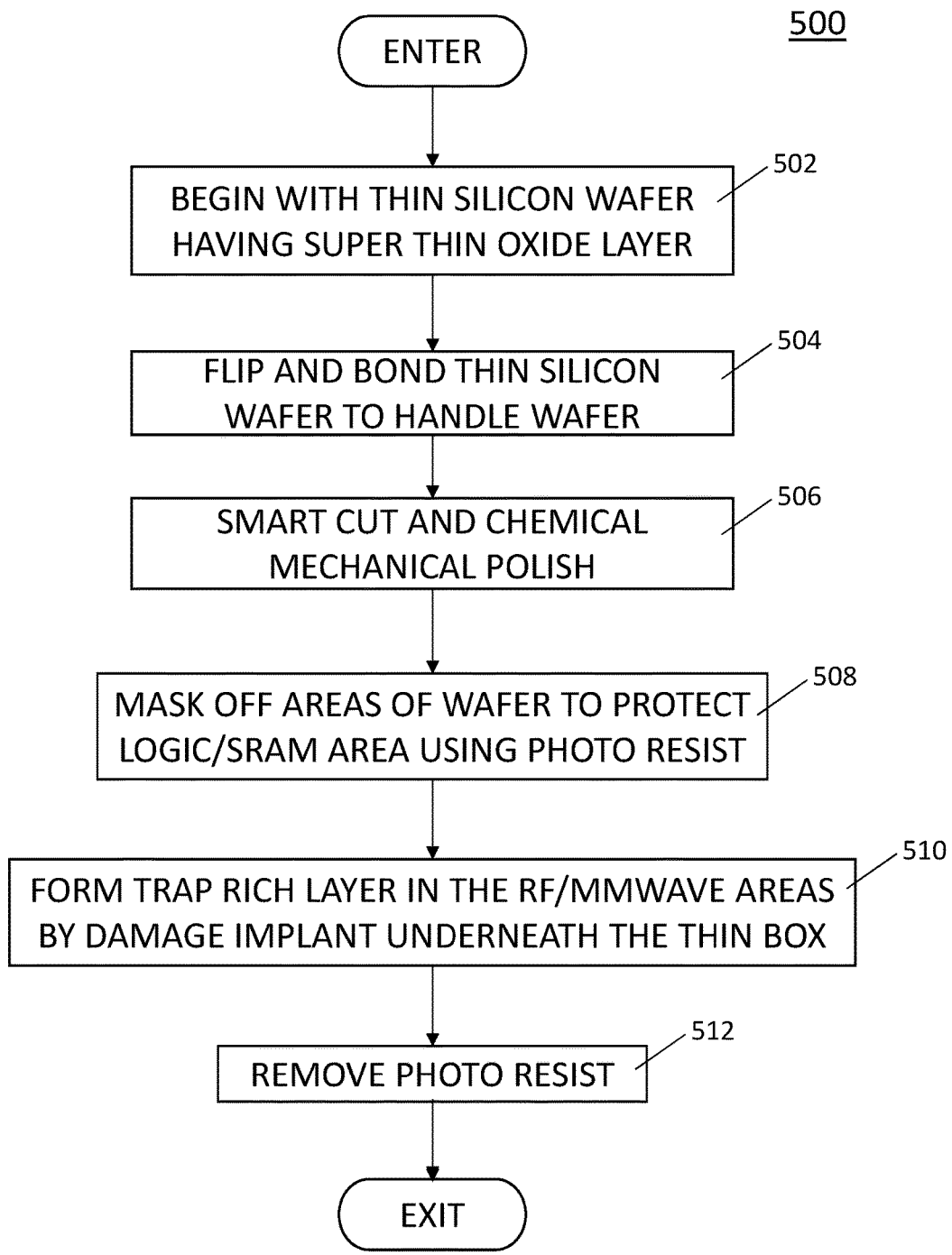
FIG. 5 is an operational flow diagram illustrating a process for manufacturing a RF-FDSOI wafer with a trap rich layer according to another embodiment of the present disclosure.
Figure 6:
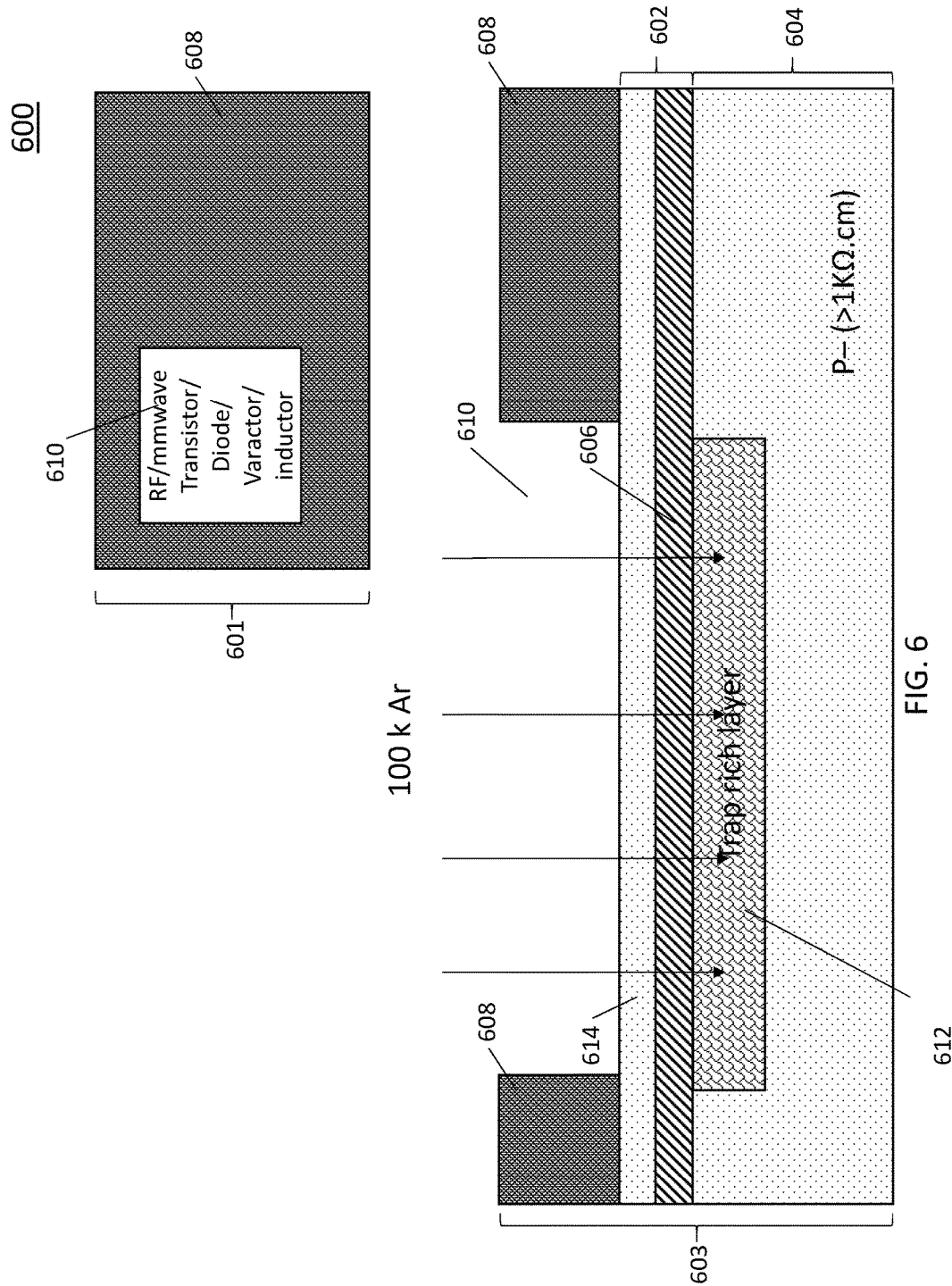
FIG. 6 is an illustration showing one example of a RF-FDSOI wafer using the process of FIG. 5.

Turning now to FIG. 5, an operational flowchart 500 is provided illustrating another process for manufacturing a RF-FDSOI wafer with a thin BOX and trap rich layer, such as wafer 600 of FIG. 6, according to one embodiment of the present disclosure. In this instance, the trap rich layer implantation is performed after the silicon wafer 602 is flipped and bonded to a handle wafer 604, as part of the smart cut step. FIG. 6 contains a top view 601 of wafer 600, as well as a cross-sectional view 603 of the side of wafer 600. It should be noted that the top view 601 and the cross-sectional view 603 are not to scale.

The procedure begins, at step 502, with a silicon wafer 602 having a super thin oxide layer 606. The silicon wafer 602 is flipped and bonded, at step 504, to a handle wafer 604 and is smart cut and chemical mechanical polished (CMP), at step 506. After the smart cut and CMP procedure, the silicon wafer 602 may include a silicon layer 614 approximately 6-20 nm thick, and a thin BOX layer 606 approximately 10-20 nm thick. As an additional part of the smart cut procedure, areas of the wafer 600 that are designated for digital logic and/or SRAM functionality are masked off, at step 508, using photo resist 608. Thus, the areas 610 of the wafer 600 that are designated for RF/mmWave usage are left exposed. A trap rich layer 612 is formed, at step 510, in the areas 610 designated for RF/mmWave usage by damage implant underneath the thin buried oxide layer 606. Examples of the damage implant may include argon (Ar) or proton implantation. The trap rich layer 612 is approximately 50-100 nm thick. The photo resist layer 608 is removed, at step 512 (e.g., by etching). The wafer 600 is then ready to have active device circuits grown, wherein the RF/mmWave circuits and passive components are formed in areas above the trap rich layer 612 and any digital/logic or SRAM circuitry is formed in areas without the trap rich layer 612.

Figure 7:
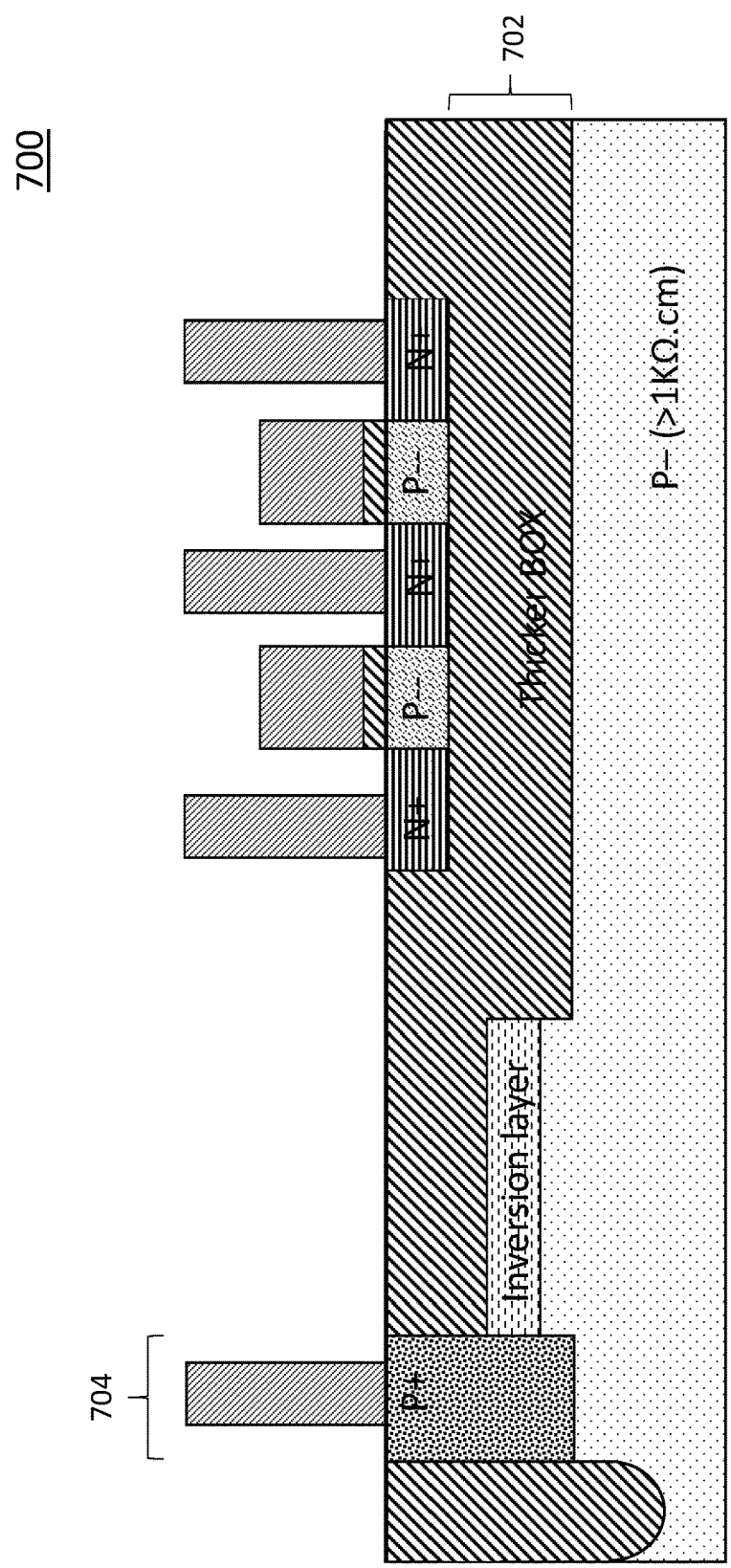
FIG. 7 is a cross-sectional illustration showing one example of an RF/mmWave NFET using RF-FDSOI with a thicker BOX layer according to one embodiment of the present disclosure.

Turning now to FIG. 7, an example of a dual-gate RF/mmWave NFET 700 using RF-FDSOI with a thicker BOX layer according to another embodiment of the present disclosure is provided. The RF/mmWave NFET 700 functions in a similar manner as described above with reference to RF/mmWave dual-gate NFET 200; however, the BOX layer 702 is thicker than the BOX layer 218 of RF/mmWave dual-gate NFET 200 (e.g., 20-2000 nm as compared to 10-20 nm). The thicker BOX layer 702 allows for limited tuning of the $V_t$ by applying a voltage at contact 704.

Figure 8:
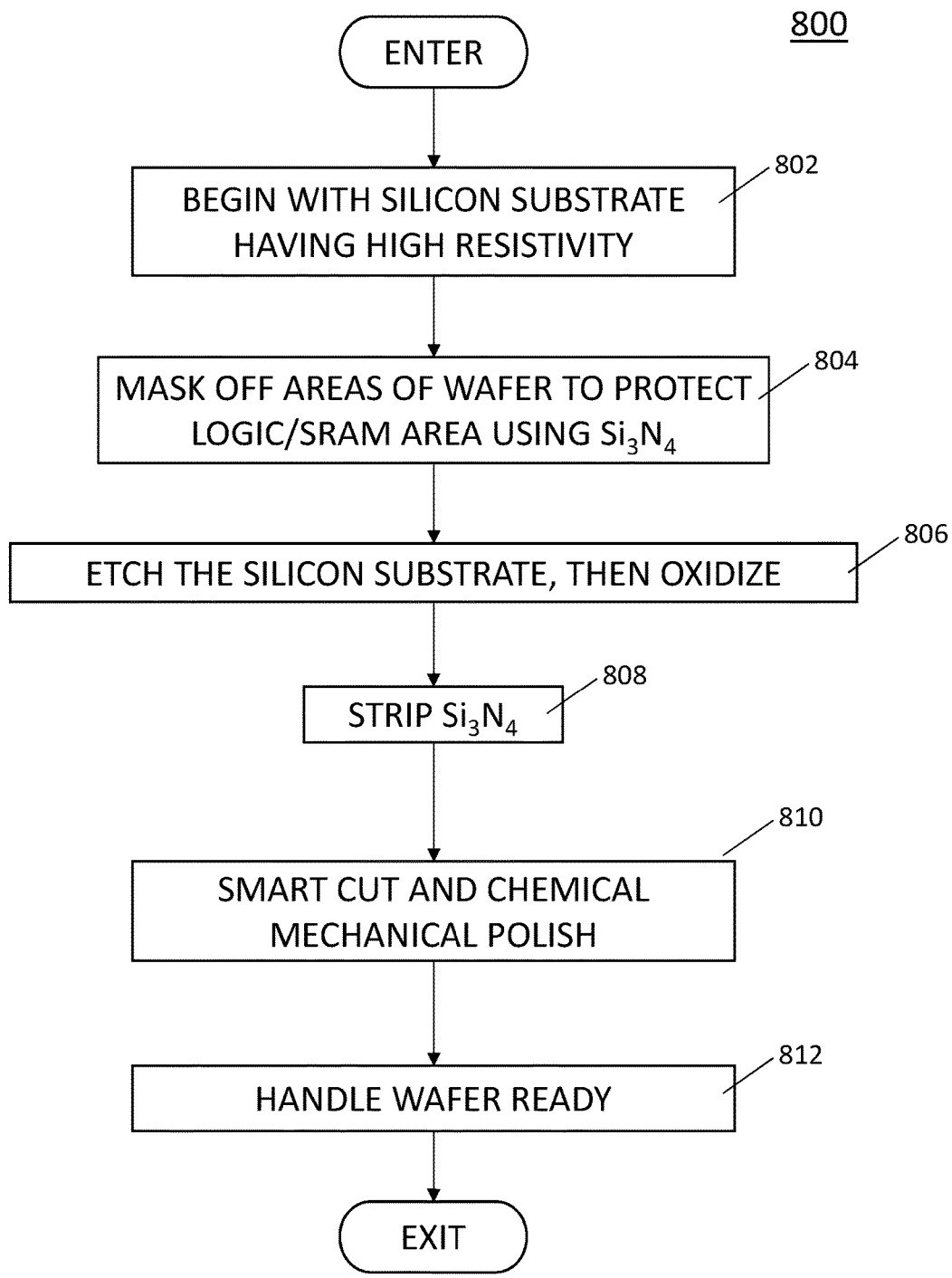
FIG. 8 is an operational flow diagram illustrating a process for manufacturing a RF-FDSOI wafer with a thicker BOX layer according to another embodiment of the present disclosure.
Figure 9:
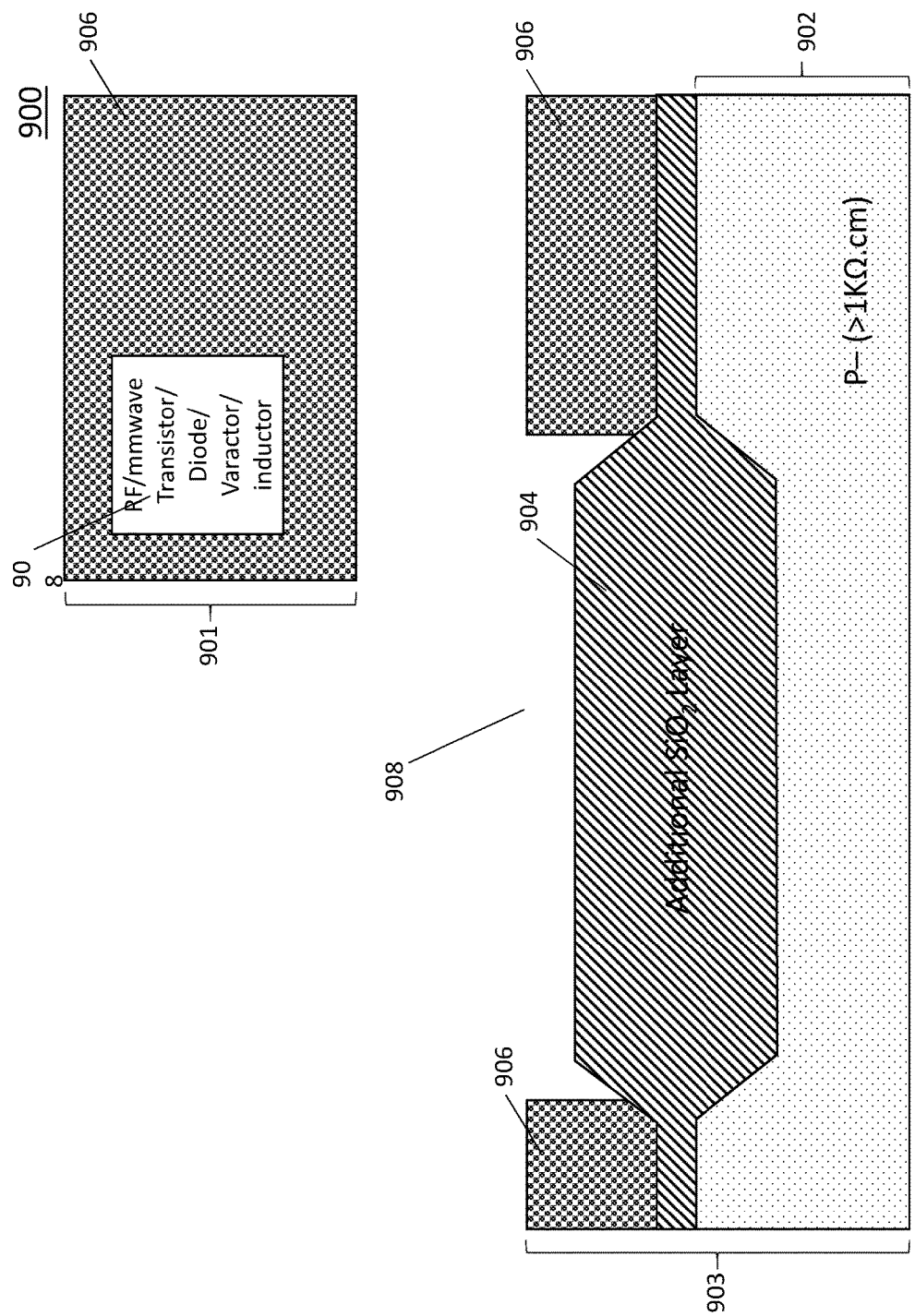
FIG. 9 is an illustration showing one example of a RF-FDSOI wafer using the process of FIG. 8.
Figure 10:
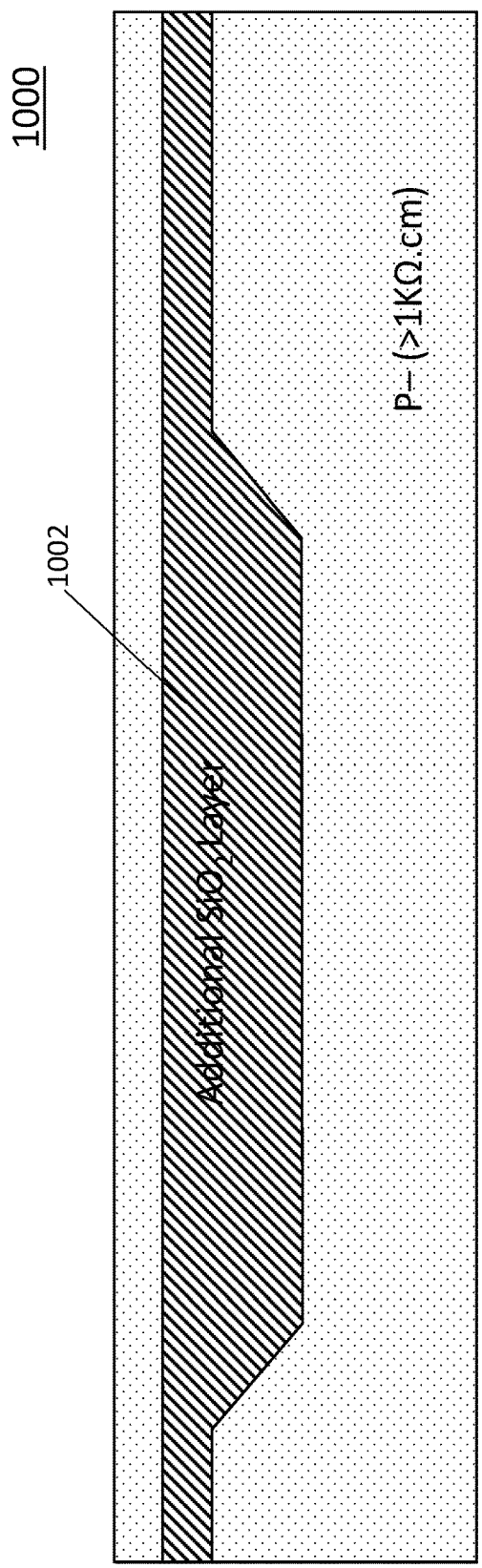
FIG. 10 is an illustration showing one example of a RF-FDSOI handle wafer resulting from using the process of FIG. 8.

In FIG. 8, an operational flowchart 800 is provided illustrating a process for manufacturing a RF-FDSOI handle wafer with a thicker BOX, such as handle wafer 900 of FIGS. 9 and 10, according to one embodiment of the present disclosure. FIG. 9 contains a top view 901 of wafer 900, as well as a cross-sectional view 903 of the side of wafer 900. It should be noted that the top view 901 and the cross-sectional view 903 are not to scale. The process illustrated in FIG. 8 provides a handle wafer 800 with a thicker BOX layer in localized areas.

The process begins, at step 802, using a silicon substrate 902 having a high resistivity (e.g., ρ>1 KΩ·cm). Areas of the wafer 900 that are designated for digital logic and/or SRAM functionality are masked off, at step 804, using nitride ($Si_3N_4$) 906. Thus, the areas 908 of the wafer 900 that are designated for RF/mmWave usage are left exposed. The silicon substrate 902 is etched, at step 806, in the areas 908 designated for RF/mmWave usage leaving indentations in the silicon substrate 902 in these areas 908. The silicon substrate 902 is oxidized to grow additional thickness of the oxidation layer 904 to 10-2000 nm thick. The nitride layer 906 is stripped, at step 808, and the wafer 900 is smart cut and chemical mechanical polished, at step 810, according to known methods. The resulting handle wafer 1000, shown in FIG. 10 is ready, at step 812, to have active device circuits grown, wherein the RF/mmWave circuits and passive components are formed in areas above the thicker BOX layer 1002 and any digital/logic or SRAM circuitry is formed in areas without the thicker BOX layer 1002.

Figure 11:
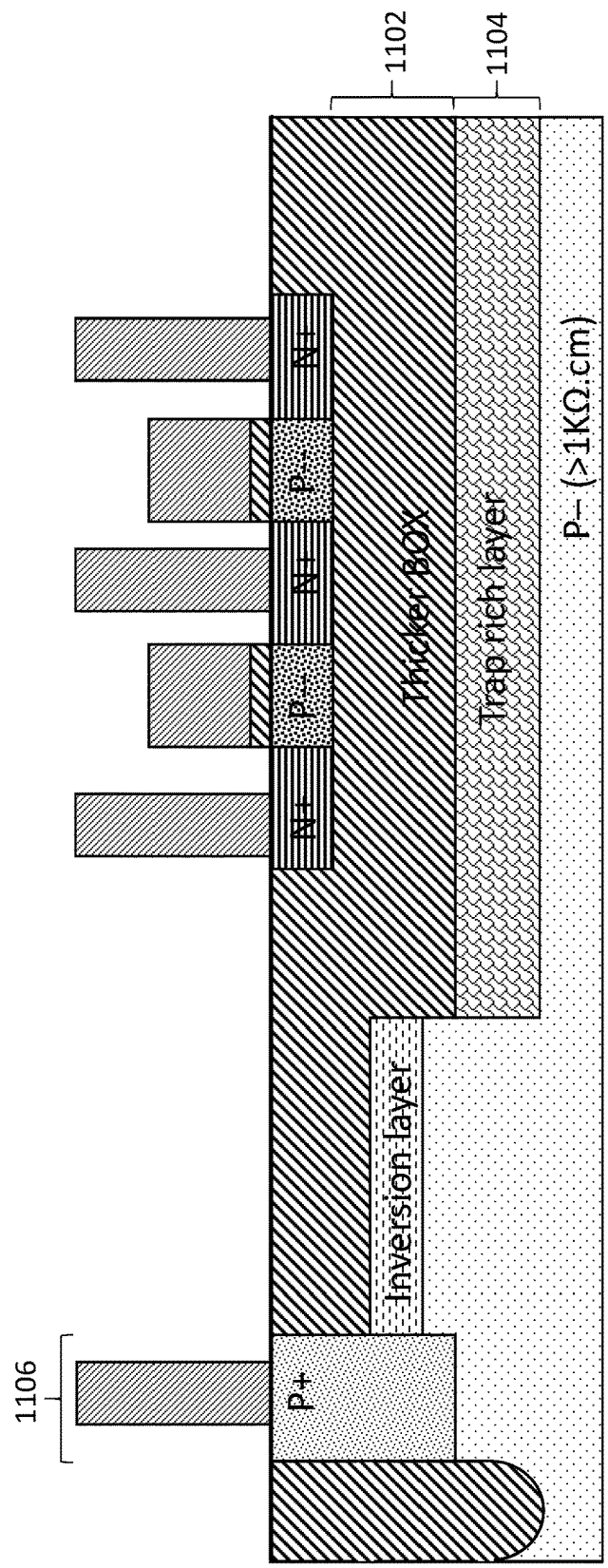
FIG. 11 is a cross-sectional illustration showing one example of an RF/mmWave NFET using RF-FDSOI with a thicker BOX layer and a trap rich layer according to one embodiment of the present disclosure.

Turning now to FIG. 11, an example of a dual-gate RF/mmWave NFET 1100 using RF-FDSOI with a thicker BOX layer and a trap rich layer according to another embodiment of the present disclosure is provided. RF/mmWave NFET 1100 acts as a combination of the approaches used in manufacturing RF/mmWave dual-gate NFET 200 and RF/mmWave dual-gate NFET 700, as RF/mmWave NFET 1100 comprises both a thicker BOX layer 1102 (e.g., around 20-2000 nm) and a trap rich layer 1104 (50-100 nm). Thus, dual-gate RF/mmWave NFET 1100 for limited tuning of the $V_t$ by applying a voltage at contact 1106.

Figure 12:
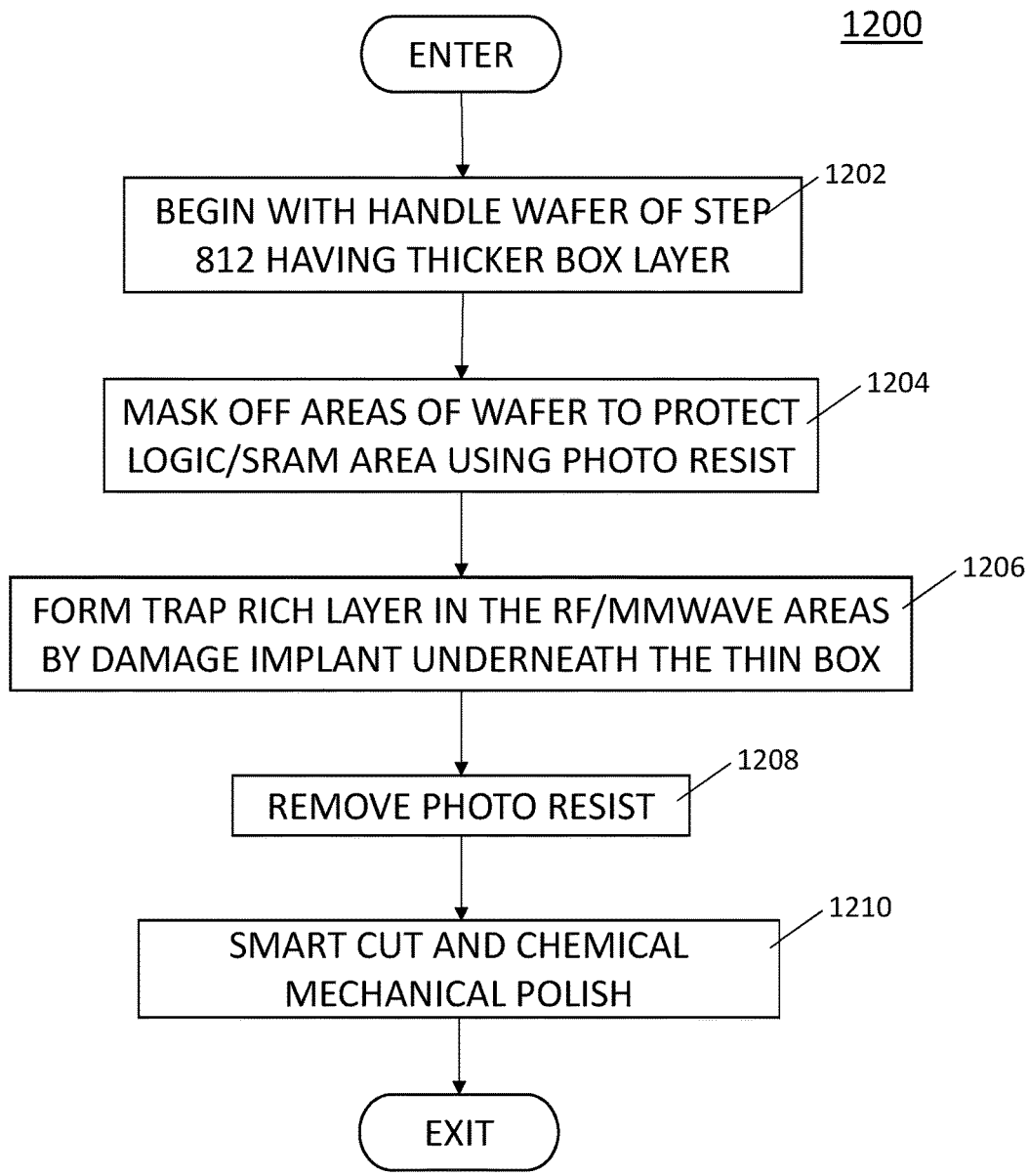
FIG. 12 is an operational flow diagram illustrating a process for manufacturing a RF-FDSOI wafer with both a thicker BOX layer and a trap rich layer according to another embodiment of the present disclosure.
Figure 13:
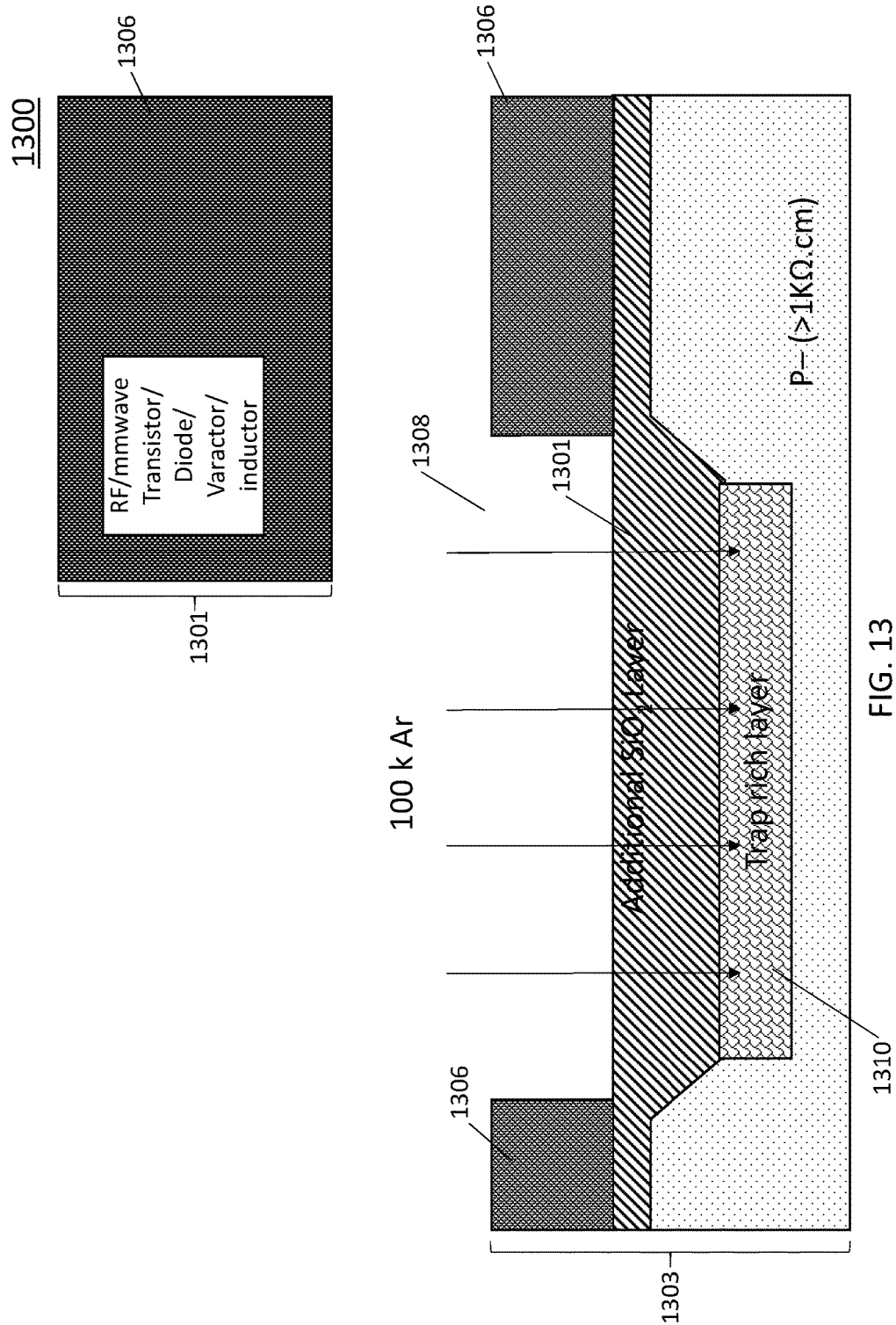
FIG. 13 is an illustration showing one example of a RF-FDSOI wafer using the process of FIG. 9 wherein the trap rich layer is implanted before flip and bond.

An operational flowchart 1200 is provided in FIG. 12, illustrating a process for manufacturing a RF-FDSOI wafer with a thicker BOX layer and a trap rich layer, such as wafer 1300 of FIG. 13, according to one embodiment of the present disclosure. FIG. 13 contains a top view 1301 of wafer 1300, as well as a cross-sectional view 1303 of the side of wafer 1300. It should be noted that the top view 1301 and the cross-sectional view 1303 are not to scale. The process begins, at step 1202, with the handle wafer 1000 created in step 812, having a thicker oxide layer 1302 (e.g., around 20-2000 nm). Areas of the wafer that are designated for digital logic and/or SRAM functionality are masked off, at step 1204, using photo resist 1306. Thus, the areas 1308 of the wafer 1300 that are designated for RF/mmWave usage are left exposed. A trap rich layer 1310 is formed, at step 1206, in the areas 1208 designated for RF/mmWave usage by damage implant underneath the thicker oxide layer 1302. The trap rich layer 1310 may be around 50-100 nm thick. Examples of the damage implant may include argon (Ar) or proton implantation. The photo resist layer 1306 is removed, at step 1208 (e.g., by etching). A wafer 1300 is smart cut and chemical mechanical polished, at step 310, according to known methods. The wafer 1300 is then ready to have another thin silicon wafer (not shown) with a super thin oxide layer flipped and bonded to it and to have active device circuits grown, wherein the RF/mmWave circuits and passive components are formed in areas above the trap rich layer and any digital/logic or SRAM circuitry is formed in areas without the trap rich layer.

Figure 14:
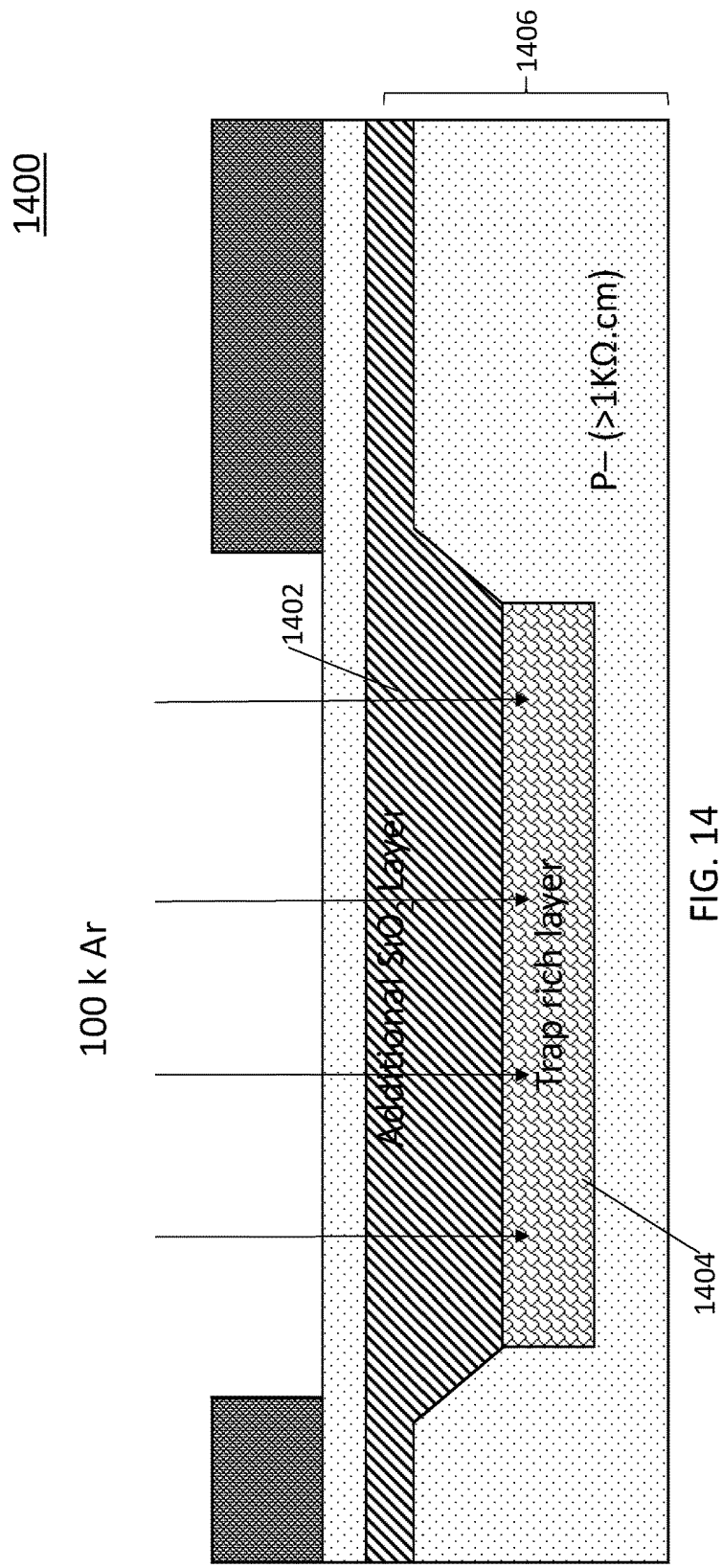
FIG. 14 is an illustration showing one example of a RF-FDSOI wafer using the process of FIG. 9 wherein the trap rich layer is implanted after flip and bond.

In the above example, the trap rich layer is implanted prior to flipping and bonding another wafer; however, FIG. 14 illustrates an example of a RF-FDSOI wafer 1400 with a thicker BOX layer 1402 and a trap rich layer 1404 where the trap rich layer 1404 is implanted after the flip and bond of the handle wafer 1406.

Figure 15:
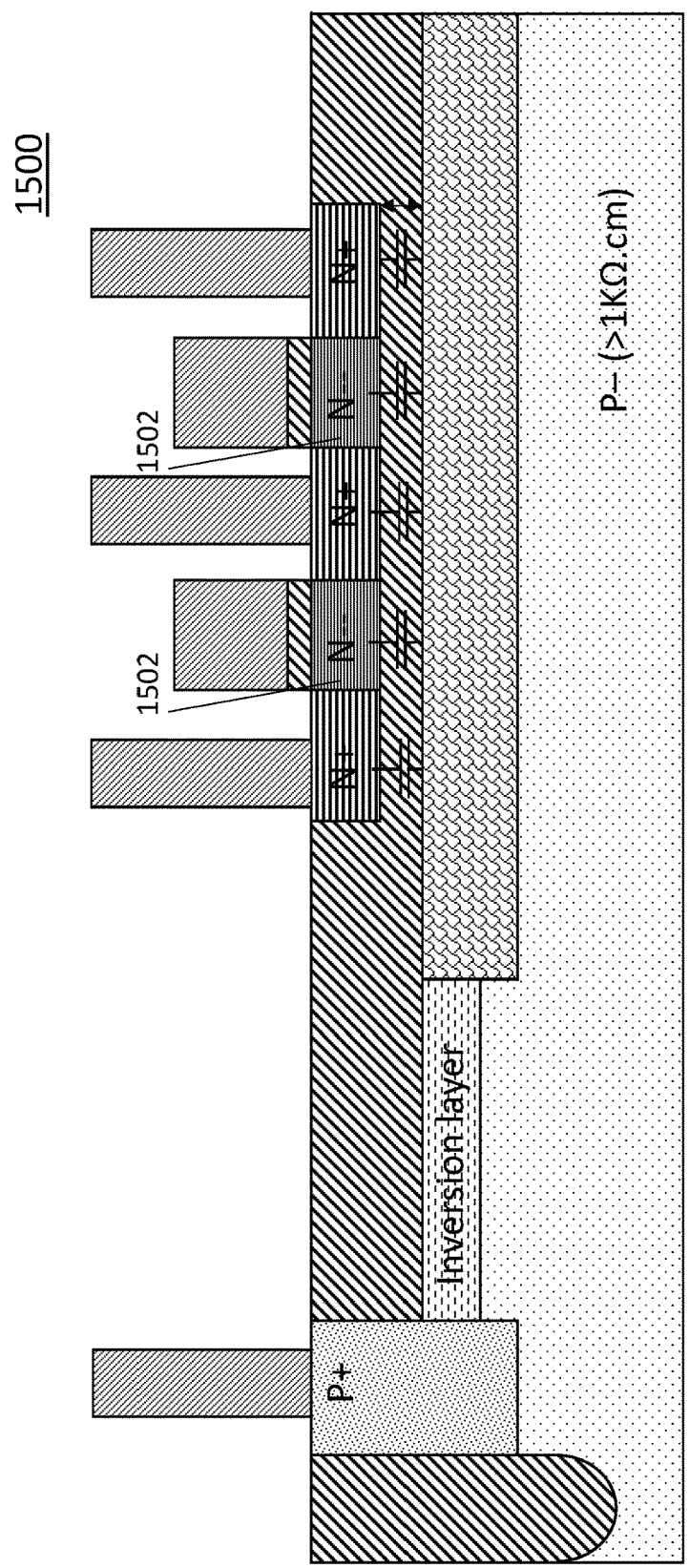
FIG. 15 is a cross-sectional illustration showing one example of an RF/mmWave varactor using RF-FDSOI on a high-resistivity substrate with a trap rich layer according to one embodiment of the present disclosure.
Figure 16:
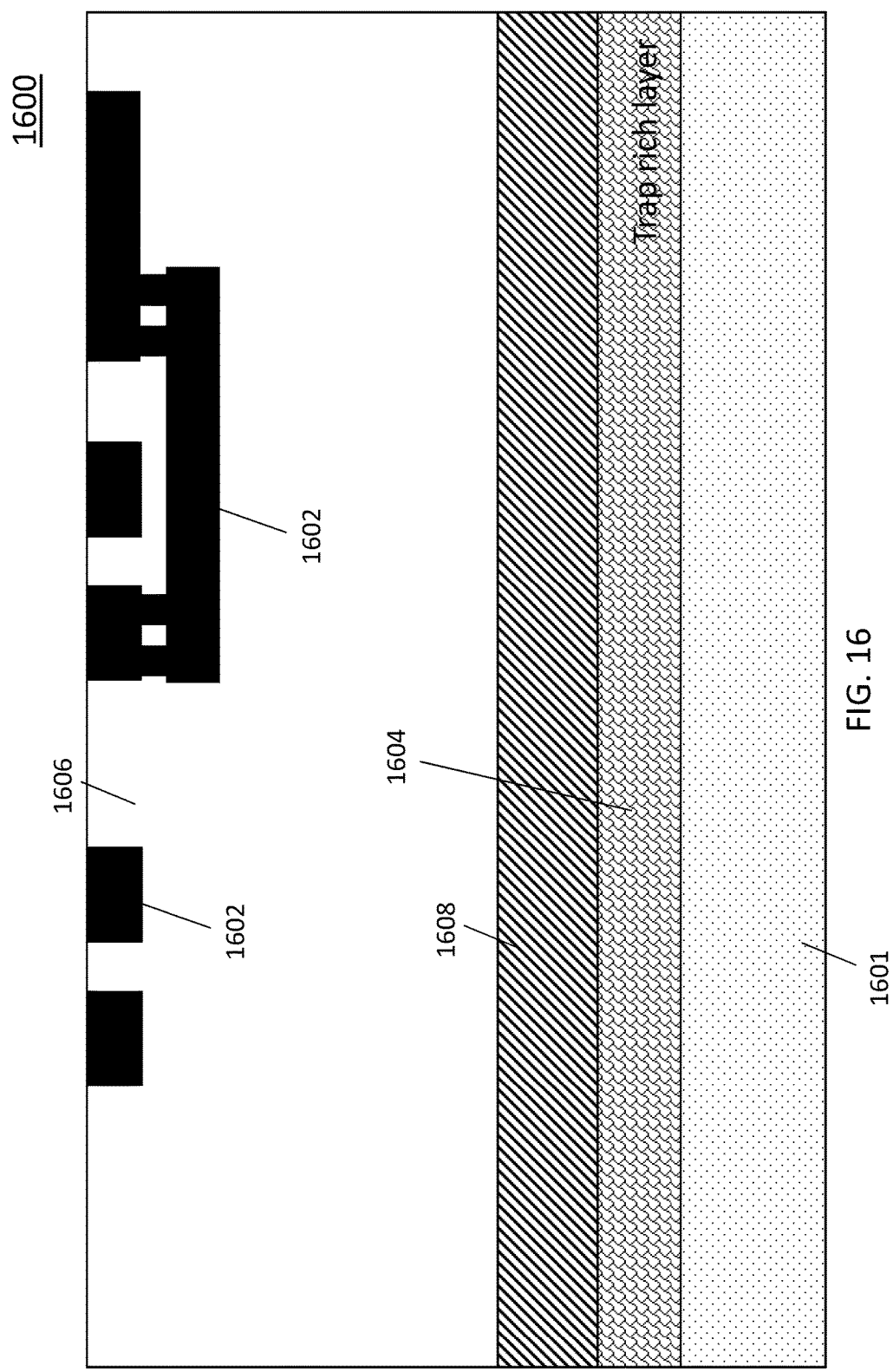
FIG. 16 is a cross-sectional illustration showing one example of an RF/mmWave inductor using RF-FDSOI on a high-resistivity substrate with a trap rich layer according to one embodiment of the present disclosure.
Figure 17:
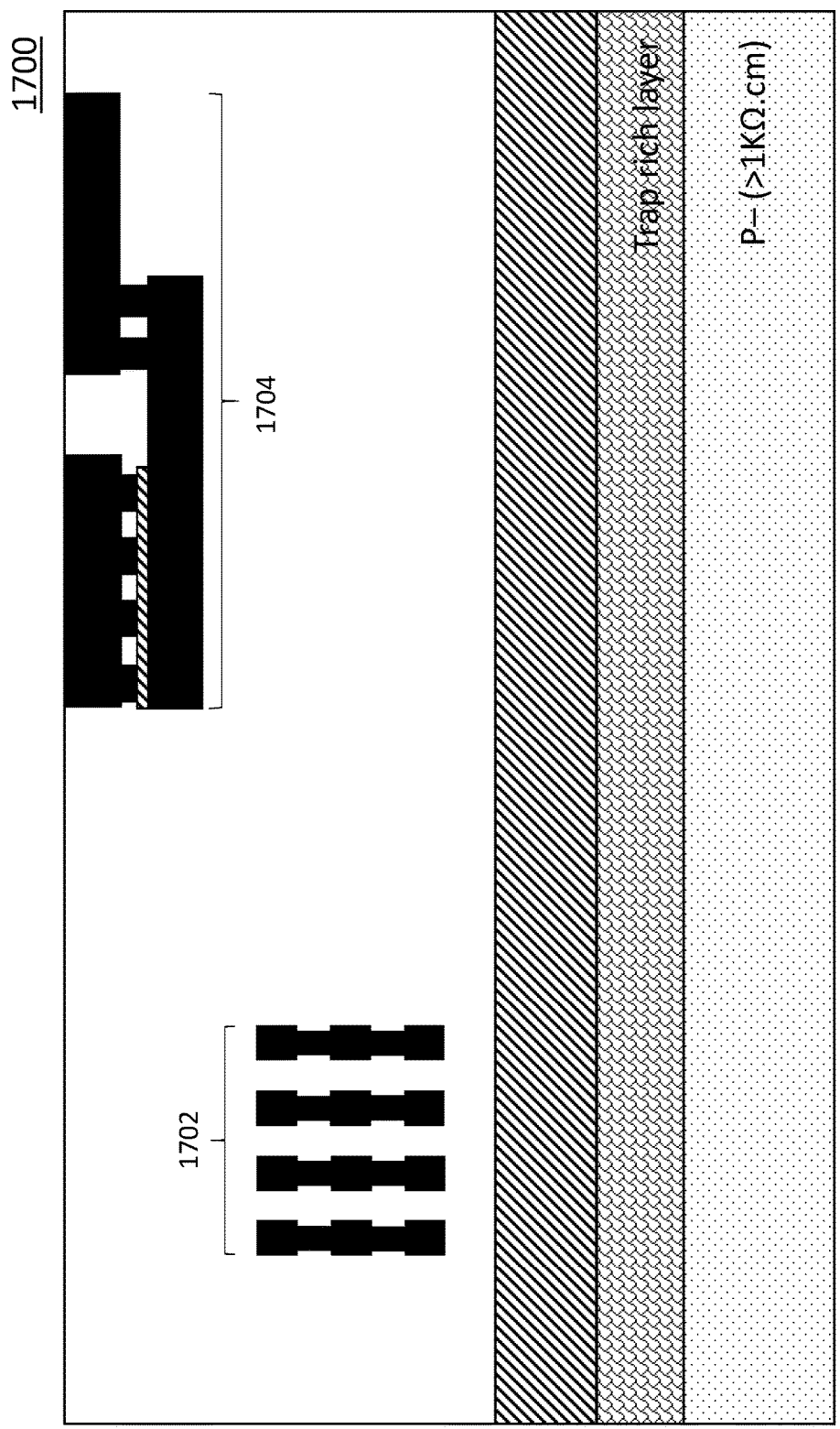
FIG. 17 is a cross-sectional illustration showing one example of an RF/mmWave vertical native (VN) capacitor and an RF/mmWave metal-insulator-metal (MIM) capacitor using RF-FDSOI on a high-resistivity substrate with a trap rich layer according to one embodiment of the present disclosure.

FIGS. 15-17 illustrate various RF elements implemented using the RF-FDSOI technology described in the examples discussed above. FIG. 15 illustrates a varactor 1500, which is similar to the RF/mmWave dual-gate NFET 200 of FIG. 2; however, the lightly positively doped portion of the silicon layer in the gate stack 202 of FIG. 2 has been replaced with lightly negatively doped silicon 1502. FIG. 16 illustrates a RF/mmWave inductor 1600 on a high-resistivity substrate 1601 with a trap rich layer 1604 for ultimate Q factor and self-resonant frequency. The RF/mmWave inductor 1600 comprises copper or other metal 1602 separated from the silicon layer 1608 by $SiO_2$ or some other insulator with a low dielectric constant, such as air, SiCOH, $FlSiO_2$, etc. Similarly, shows example RF/mmWave capacitors, such as vertical native (VN) capacitor 1702 (or Metal-Oxide-Metal capacitor (MOM)) and Metal-Insulator-Metal (MIM) capacitor 1704. Like the inductor 1600 of FIG. 16, both VN capacitor 1702 and MIM capacitor 1704 have very high Q factors and desirable self-resonant frequencies. These passive components of FIGS. 15-17 may all be combined with other RF/mmWave devices which are all selectively located above a thicker BOX, a trap rich layer, or a combination thereof. In addition, these components may be combined on the same wafer as digital/logic or SRAM components which have been constructed using traditional FDSOI methods and structures.

Non-Limiting Embodiments

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for fabricating radio frequency fully depleted silicon on insulator (RF-FDSOI) devices, the method comprising:
   constructing a silicon wafer for digital circuits using fully depleted silicon on insulator technology having a thin buried oxide layer; and
   constructing localized areas of the silicon wafer comprising at least one of radio frequency circuits and passive devices, and further comprising a trap rich layer implanted underneath a thin buried oxide layer.

2. The method of claim 1, wherein the silicon wafer comprises a silicon substrate having a resistivity greater than 1 KΩ·cm.

3. The method of claim 1, wherein the localized areas of the silicon wafer are formed by:
   masking off areas of the silicon wafer designated for digital circuits using photo resist;

forming a trap rich layer in the localized areas by damage implantation underneath the thin oxide layer; and removing the photo resist.

4. The method of claim 3, further comprising:

flipping and bonding the silicon wafer to a handle wafer;

smart cutting and chemical mechanical polishing the silicon wafer; and growing at least one of radio frequency circuits and passive devices in the localized areas and digital circuits on other areas of the silicon wafer.

5. The method of claim 4, wherein the trap rich layer is between 50 nm and 100 nm thick.

6. The method of claim 4, wherein the trap rich layer is formed prior to flipping and bonding.

7. The method of claim 4, wherein the trap rich layer is formed after flipping and bonding.

8. The method of claim 3, wherein the damage implantation includes one of argon or proton implantation.

9. The method of claim 2, wherein the localized areas of the silicon wafer comprise a buried oxide layer that is thicker than the thin buried oxide layer.

10. The method of claim 9, wherein the thicker oxide layer is formed by:

masking off areas of the silicon wafer designated for digital circuits using nitride (Si3N4);

etching the silicon substrate;

oxidizing the silicon substrate to grow additional thickness of the oxide layer;

stripping the nitride; and smart cutting and chemical mechanical polishing the silicon wafer.

11. The method of claim 10, wherein the thicker oxide layer is between 20 and 2000 nm thick.

12. The method of claim 9, wherein the localized areas of the silicon wafer comprise a trap rich layer implanted underneath the thicker buried oxide layer.

13. A radio frequency fully depleted silicon on insulator (RF-FDSOI) device comprising:

a silicon wafer for digital circuits using fully depleted silicon on insulator technology having a thin buried oxide layer; and localized areas of the silicon wafer comprising at least one of radio frequency circuits and passive devices, and further comprising a trap rich layer implanted underneath a thin buried oxide layer.

14. The RF-FDSOI of claim 13, wherein the silicon wafer comprises a silicon substrate having a resistivity greater than 1 KΩ·cm.

15. The RF-FDSOI of claim 13, wherein the trap rich layer is between 50 nm and 100 nm thick.

16. The RF-FDSOI of claim 13, wherein the localized areas of the silicon wafer comprise a buried oxide layer that is thicker than the thin buried oxide layer.

17. The RF-FDSOI of claim 16, wherein the thicker oxide layer is between 20 and 2000 nm thick.

18. The RF-FDSOI of claim 16, wherein the localized areas of the silicon wafer comprise a trap rich layer implanted underneath the thicker buried oxide layer.

* * * * *